ELECTRONICALLY TUNABLE RESONANT CIRCUITS

Filed Sept. 20, 1968 3 Sheets-Sheet 1

David O. Hansen
Neal L. Roy
INVENTORS

BY Eli A. Oson

ATTORNEY

ELECTRONICALLY TUNABLE RESONANT CIRCUITS

Filed Sept. 20, 1968 3 Sheets-Sheet 2

David O. Hansen
Neal L. Roy
INVENTORS

BY [signature]

ATTORNEY

David O. Hansen
Neal L. Roy
INVENTORS
BY [signature]
ATTORNEY

United States Patent Office 3,551,846

Patented Dec. 29, 1970

3,551,846

ELECTRONICALLY TUNABLE RESONANT CIRCUITS

David O. Hansen, Westminster, and Neal L. Roy, Redondo Beach, Calif., assignors to TRW Inc., Redondo Beach, Calif., a corporation of Ohio Filed Sept. 20, 1968, Ser. No. 761,152

Int. Cl. H03b 5/12

U.S. Cl. 331—117 15 Claims

ABSTRACT OF THE DISCLOSURE

An electronic circuit including a complex reactive impedance element and having a feedback path so that the impedance may be varied electronically by varying the gain of a feedback amplifier. For example, the capacitance of a capacitor or the inductance of an inductor may be varied in this manner. The capacitor and inductor may form part of a parallel or series resonant circuit and may be used for tuning a broadcast receiver. Alternatively, the resonant circuit may provide a bandpass or band-rejection filter having a controllable width. The gain of the feedback amplifier may also be controlled electronically, for example, by varying the voltage applied to a field-effect transistor.

BACKGROUND OF THE INVENTION

This invention relates generally to electronic circuits and particularly relates to an electronically tunable resonant circuit.

Every broadcast receiver includes a tunable resonant circuit for tuning the set to the frequency of the carrier wave of a particular station. It is conventional practice to tune these resonant circuits mechanically by either varying the capacitance or the inductance of the circuit.

In recent years it has been proposed to manufacture many electronic circuits in the form of monolithic chips or integrated circuits. Such monolithic chips may contain a large number of circuit components. Accordingly it has been proposed to manufacture entire broadcast receivers such as an automobile receiver from one or more integrated chips. In this case, of course, the problem remains how to tune the set to various broadcast stations. A tunable inductor or capacitor would have many times the size of the entire receiver in integrated circuit form. Accordingly such an arrangement would practically obviate the advantages of small size and reliability obtainable with a receiver made of monolithic chips.

It is accordingly an object of the present invention to provide an electronic circuit including a resonant circuit, the reactive impedance of which may be electronically varied.

Another object of the present invention is to provide an electronic circuit aranged in such a manner that its resonant frequency may be varied by varying a voltage applied thereto, thereby to obviate the need of a tunable capacitor or inductor.

A further object of the present invention is to provide either a bandpass or band-rejection filter, the passband of which may be varied electronically.

SUMMARY OF THE INVENTION

An electronic circuit for electronically varying the reactance of a reactive impedance element in accordance with the present invention comprises a reactive impedance element. This may be either a capacitor or an inductor. Alternatively this may be a complex impedance such as a series or parallel resonant circuit. A source of a carrier wave signal is coupled to the impedance element.

A first amplifier is coupled to the impedance element for deriving an output signal therefrom.

A second amplifier is coupled between the first amplifier and the impedance element and provides a feedback therebetween. The gain of the second amplifier may be varied. If the product of the gains of the two amplifiers is less than unity, the reactive impedance of the impedance element may be varied by varying the gain of the second amplifier. This in turn may be effected by using a field-effect transistor, the resistance of which may be varied over wide limits by changing the voltage applied to the transistor.

The foregoing and other objects of the present invention will become more and better understood when taken in conjunction with the following description and accompanying drawings, throughout which like characters indicate like parts and which drawings form a part of this application.

DESCRIPTION OF THE PREFERRED EMBODIMENTS

Figure 1:
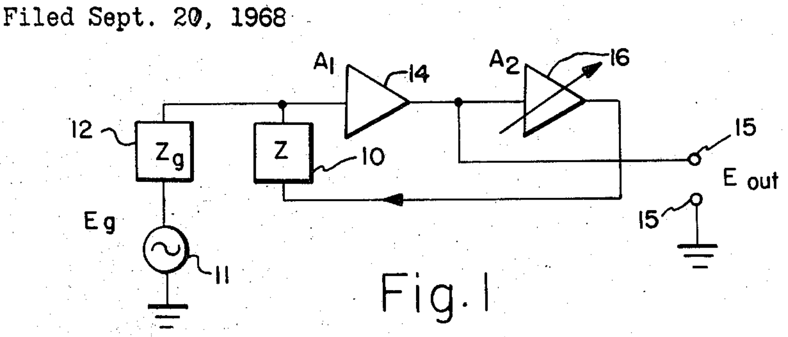
FIG. 1 schematically illustrates a block diagram of an electronic circuit embodying the present invention and which will be used for analyzing the operation thereof.
Figure 2:
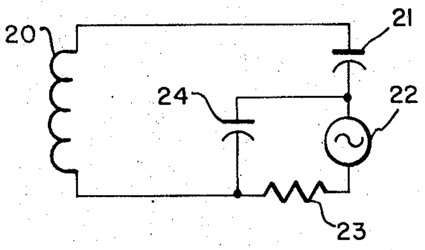
FIG. 2 is an equivalent circuit diagram of a portion of the circuit of FIG. 1 for analyzing the feedback path.

Referring now to the drawings and particularly to FIGS. 1 and 2, there is illustrated schematically in block form a feedback circuit embodying the present invention. This feedback circuit has the purpose to vary the reactance of a simple or complex impedance by varying the gain of a feedback amplifier. Accordingly, referring to FIG. 1, there is illustrated a box 10 labeled Z indicating a reactive impedance element such as a capacitive impedance to be controlled. The carrier wave signal is represented by the generator 11 developing a signal voltage $E_g$ with an impedance 12 in series therewith which may be called $Z_g$. In other words $E_g$ and $Z_g$ represent jointly the generator or voltage source which is directly connected to the impedance element Z. A first amplifier 14 having a gain $A_1$ is connected to the impedance element 10 and the output signal $E_{out}$ is obtained from terminals 15, one of which is connected to the amplifier 14 output and the other to ground.

A second or feedback amplifier 16 whose gain is variable as shown is connected between the output of amplifier 14 and the other terminal of the impedance element 10. This second amplifier 16 has a variable gain of $A_2$.

The circuit of FIG. 1 will now be anaylzed. It is assumed that the input impedance looking into the impedance element 10 is substantially infinite and that the output impedance viewed from the output terminals 15 is substantially zero. Assume further that the impedance of the impedance element 10 is a pure capacitance C, the value of $C_{eff}$ which is the effective or the actual capacitance of element 10 is as follows:

$$C_{eff}=(1-A_1A_2)C \qquad (1)$$

Accordingly it follows that if $A_1A_2$ is less than 1 and if $A_2$ may be varied, $C_{eff}$ or the effective capacitance of the impedance element 10 may be varied.

Considering now the equivalent circuit of FIG. 2 this may be considered a parallel resonant circuit including an inductor 20 and a capacitor 21 connected in parallel. The capacitor 21 may represent the impedance element 10 of FIG. 1. The feedback voltage may be represented by E and is represented by the generator 22 in series with a resistor 23, a capacitor 24 bypassing the generator 22 and restistor 23. The voltage developed by the generator 22 is as follows:

$$E=A_1A_2V_{in} \qquad (2)$$

where $V_{in}$ is the voltage applied to the impedance element 10 and generated by the generator 11.

Assuming now that the gain $A_2$ is adjusted to be zero, then the resonant frequency $f$ of the resonant circuit 20, 21 is as follows:

$$f_0=\frac{1}{2\pi\sqrt{LC}} \qquad (3)$$

where L is the inductance of inductor 20.

Generally of course the gain $A_2$ is variable between zero and one to vary the resonant frequency. Accordingly where $A_2$ is not zero the resonant frequency $f_s$ is given by the following formula:

$$fs=\frac{1}{2\pi\sqrt{L}}\sqrt{(1-A_1A_2)C} \qquad (4)$$

Accordingly it will be seen that by varying the gain $A_2$, the resonant frequency of the circuit may be varied.

As will be evident from an inspection of FIG. 2, the resistance of resistor 23 is in series with the feedback voltage source 22. Accordingly the time constant T of the circuit is given as follows:

$$T=C_gR_o \qquad (5)$$

where $C_g$ is the capacitance of capacitor 24 and $R_o$ is the resistance of resistor 23. From a comparison of Formulas 4 and 5 it will be evident that if the reciprocal of the time constant T is much larger than the frequency $f_s$, the effect of the capacitor 24 and resistor 23 may be neglected. Assuming, for example, a value of 20 ohms for $R_o$ and 100 pf. (picofarad) for $C_g$ this is true for frequencies of less than tens of megahertz. In other words, with the values given, $1/T$ is $0.5\times10^9$.

It is also feasible to exchange inductor 20 and capacitor 21 in the circuit of FIGS. 1 and 2. In other words instead of varying the capacitance of the capacitor it is feasible to vary the inductance of the inductor. The complex impedance of the inductor may be designated $Z_L$ and the following relationship holds:

$$Z_L=i2\pi fL_{eff}=\frac{i2\pi fL}{(1-A_1A_2)} \qquad (6)$$

where $L_{eff}$ is the effective inductance of the inductor. From Formula 6 we may obtain Formula 7 giving directly the effective value of the inductance:

$$L_{eff}=\frac{L}{(1-A_1A_2)} \qquad (7)$$

In practice the capacitance and inductance in accordance with Formulas 1 and 6 may be changed over a range of approaching 1000 to 1. It is somewhat more difficult in practice to achieve a very large change of $L_{eff}$ than of $C_{eff}$. The value of the capacitance C may range from 50 pf. upwards. This should be compared to other variable capacitors such as varactor diodes which usually have a maximum capacitance of the order of 500 pf. and may be changed over a range of only about 3.5 to one.

Figure 3:
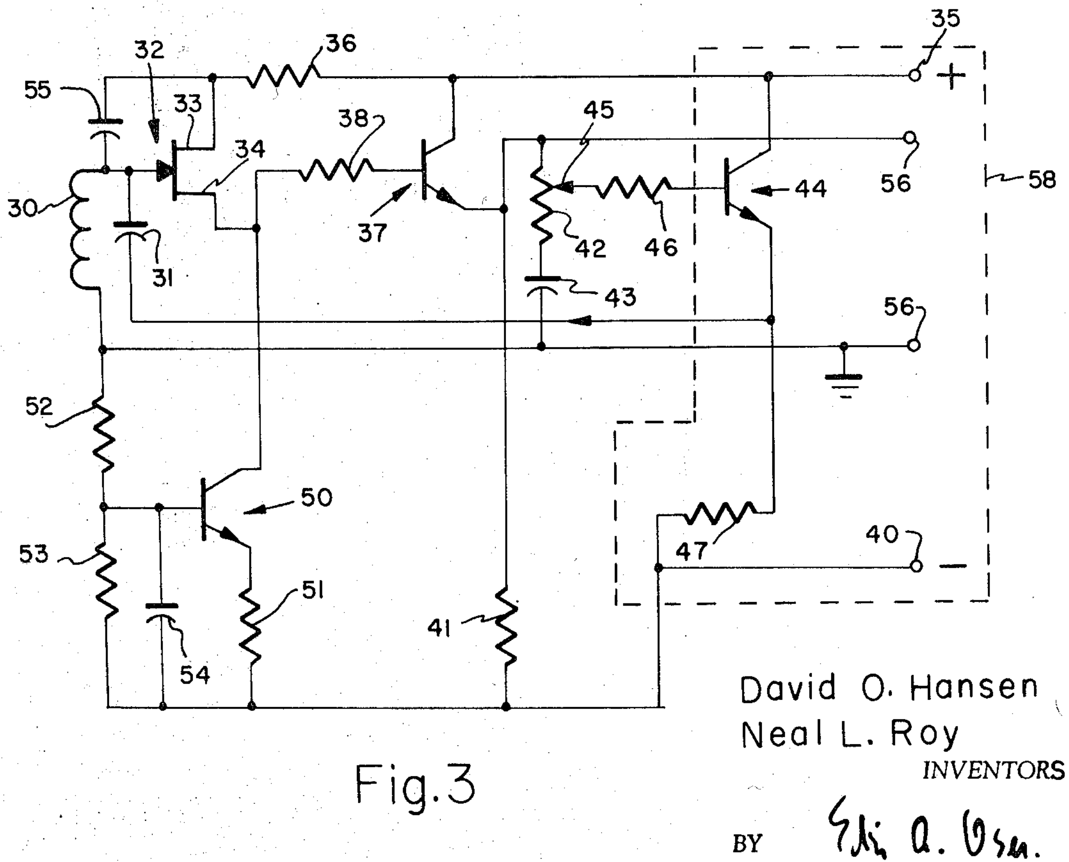
FIG. 3 is a circuit diagram showing by way of example a portion of a broadcast receiver having a variable resonant input circuit.

Referring now to FIG. 3 there is shown a circuit including a variable parallel resonant circuit suitable for tuning through the amplitude-modulated broadcast receiver band. Thus the circuit has an inductor 30 and a capacitor 31 connected in parallel. One terminal of the inductor 30 is grounded as shown while the other terminal is connected to the gate of a field-effect transistor 32. The field-effect transistor 32, as is conventional, includes a drain 33 and a source 34. As shown by way of example, this is an n-channel field-effect transistor. In a field-effect transistor the current flow between drain and source is controlled by the voltage between the gate and the source. This in turn, controls the conductance or the resistance between the drain and source. Accordingly the drain 33 of the transistor is connected to a positive voltage terminal 35 by resistor 36, while the source 35 is connected to a source of constant current supplied by transistor 50 as will be more fully explained hereinafter. The purpose of using a field-effect transistor is to minimize the load on the input signal.

A second transistor 37, which may be of the npn type as shown, jointly forms with the transistor 32 the first amplifier 14 of the circuit of FIG. 1. The base of transistor 37 is connected to the transistor source 34 by a resistor 38. The collector of transistor 37 is connected to the positive terminal 35, while the emitter is connected to the terminal 40 providing a negative voltage through a load resistor 41.

The output signal is obtained from the emitter of transistor 37 and may be developed across a load resistor 42, which is connected to ground by a series capacitor 43. The feedback amplifier to represented by the transistor 44, which may also be an npn transistor as shown. The gain of the feedback amplifier may be varied by a potentiometer or slide 45 which may be moved across the resistor 42 and is connected to the base of transistor 44 by a resistor 46. Again, the collector of transistor 44 is connected directly to the positive terminal 35, while the emitter is connected to the negative terminal 40 through a load resistor 47.

Accordingly, the transistor 44 is a feedback amplifier of the emitter follow type and its gain is variable by the slide 45.

In order to reduce the load on the field-effect transistor 32 the source 34 is connected to the negative terminal 40 by a constant-current source, the magnitude of which should be about $0.8I_d$ where $I_d$ is the saturation current of the field-effect transsitor 32, the constant current source is formed by the transistor 50 which may also be an npn transistor as shown. To this end, the collector of transistor 50 is connected directly to the source 34, while its emitter is connected to the negative terminal 40 through a resistor 51. A pair of resistors 52 and 53 are connected in series between ground and the negative terminal 40 to provide a voltage divider. Accordingly the junction point of resistors 52, 53 is connected directly to the base of transistor 50 and a capacitor 54 is connected across resistor 53 to minimize fluctuations of the base voltage.

Capacitor 55 is connected directly between the gate of transistor 32 and its drain 33. Capacitor 55, in conjunction with the drain resistor 36, serves the purpose to damp out high-frequency instabilities.

The output signal is obtained from the output amplifier 37. Accordingly, the output signal is derived across load resistors 41, 42 and may be obtained from output terminals 56, one of which is connected to the emitter of transistor 37, while the other one is grounded.

The circuit of FIG. 3 operates as follows: as stated above, transistors 32 and 37 correspond to the amplifier 14 of FIG. 1. The product of their gains (see Formula 4) may be made to approximate 0.99 or greater. Similarly transistor 44 represents the amplifier 16 and its gain may be varied by the slide 45. The maximum gain of the feedback amplifier may also approach 0.99. The output impedance of the feedback amplifier 44 is about 20 ohms. This corresponds to the resistor 23 of FIG. 2. Accordingly, the Q of the circuit which equals $\omega L/R$, is about 35, for the AM broadcast band which is normally sufficient.

It should be noted that the transistor 50 operates in a conventional manner as a constant current source and therefore supplies a constant current between the drain 33 and the source 34 of the field-effect transistor 32. Accordingly, it is not believed to be necessary to describe the operation of the constant current source.

In some cases it may be necessary or desirable to have a resonant circuit with a Q which is higher than 35. In that case, the portion of the circuit of FIG. 3, indicated by the dotted line 58, may be replaced by the circuit of FIG. 4. This includes the transistor 44 and a second transistor 60 connected in a configuration which may be called a super alpha emitter follower.

Accordingly, the base of transistor 60, which should be of the opposite conductivity type as is the transistor 44 and is therefore a pnp transistor as shown is directly connected to the collector of npn transistor 44. Similarly, the emitter of transistor 44 is tied to the collector of transistor 60 and forms the feedback to the capacitor 31. The base of transistor 60 is connected to the positive voltage terminal 35 by a resistor 61, while the emitter is connected to the terminal 35 by a Zener diode 62 to control the currents through the two transistors 44 and 60.

Figure 4:
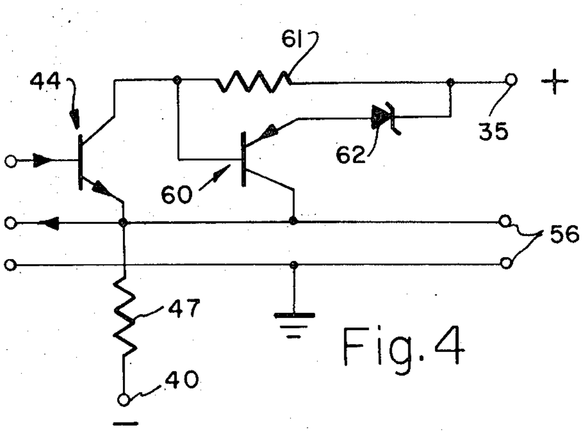
FIG. 4 is a circuit diagram of a compound emitter follower which may be substituted for a portion of the circuit of FIG. 3 and which has an extremely low output resistance.

The output impedance of the circuit of FIG. 4 is on the order of 1 ohm or less, and as a result, the Q of the resonant circuit 30, 31 may be as much as 700 at 500 kHz. (kilohertz). Accordingly, the transistor 60 of the circuit of FIG. 4 substantially reduces the output impedance. It should be noted that essentially all the signal current from the collector of transistor 44 flows into the base of transistor 60 and this current is multiplied by the beta of the transistor, which results in the low output impedance of this configuration.

It will be understood that the circuit specification of the amplitude-modulated broadcast receiver circuit of FIGS. 3 and 4 may vary according to the design for a particular application. The following circuit specifications are included, by way of example only, as suitable for the AM broadcast band.

Field-effect transistor 32—2N4416
Transistors:
- 37—2N3643
- 44—2N3643
- 50—2N3643
- 60—2N3644

Zener diode 62—6 volt breakdown voltage
Resistors:
- 36—10 ohms
- 38—10 ohms
- 42—1000 ohms
- 46—10 ohms
- 52—5100 ohms
- 53—5100 ohms
- 61—1200 ohms Inductor 30—1 millihenry
Capacitors:
- 31—200 picofarads
- 54—1 microfarad
- 55—5 picofarads It should be noted that the values of resistors 51, 41 and 47 depend on the supply voltages and accordingly their values are not given.

Figure 5:
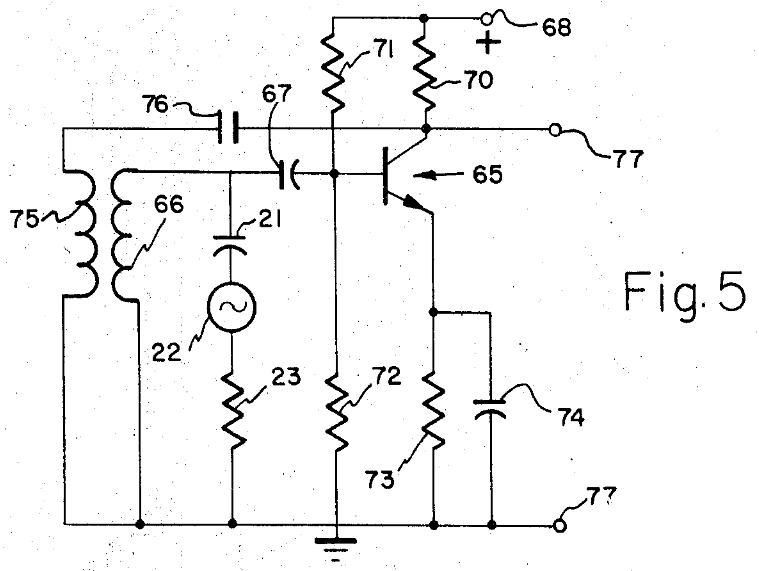
FIG. 5 is a circuit diagram of a tuned-base transistor oscillator having an electronically variable capacitor.

It is also feasible to tune an oscillator by means of the feedback circuit of the present invention. Such an oscillator has been illustrated in FIG. 5. This oscillator is of the type where a resonant circuit is coupled to the base of the transistor, while the feedback is obtained from the collector. Accordingly, the circuit of FIG. 5 includes a transistor 65, which may be of the npn type as shown. There is provided a parallel resonant circuit including an inductor 66 and a capacitor 21, previously referred to in connection with FIG. 2. One terminal of the inductor 66 is grounded as shown, while the other terminal is coupled to the base of transistor 65 by a blocking capacitor 67. The collector of transistor 65 is supplied with a positive voltage from the terminal 68 through a resistor 70. The base is maintained at a voltage obtained from a voltage divider 71, 72. The two resistors 71, 72 are connected between the positive terminal 68 and ground and their junction is directly connected to the base of transistor 65. The emitter of transistor 65 is provided with a bias network consisting of a resistor 73 and a capacitor 74 connected in parallel between the emitter and ground.

A feedback inductor 75 is coupled to the inductor 66 of the resonant circuit and has one terminal grounded while the other terminal is coupled to the collector of transistor 65 by a blocking capacitor 76. The output signals may be obtained from output terminals 77, one of which is connected to the collector of transistor 65 while the other one is connected to ground.

The transistor oscillator as described so far is conventional. The oscillatory wave excited in the resonant circuit 21, 66 is impressed on the base of transistor 65. The oscillatory wave is also fed back by feedback coil 75 from the collector to sustain the oscillation.

In accordance with the present invention the capacitance of capacitor 21 is varied electronically in the manner previously described. The feedback circuit is shown schematically by the voltage source 22 and the resistor 23 connected between capacitor 21 and ground. Any one of the feedback circuits previously disclosed may be substituted for the elements 22, 23. For example, the amplifiers 14, 16 or the amplifiers 32, 37, the slide 45 and the transistor 44 may be used for the feedback circuit or alternatively, the circuit of FIG. 4.

The tunable resonant circuit FIG. 3 still requires a variable resistor for varying the gain of the feedback amplifier. In some cases it may not be desirable to vary a potentiometer for tuning the resonant circuit. In such cases the circuit of FIG. 6 may be used with advantage. Here the variable resistance is replaced by a field-effect transistor. Such a transistor can be made to vary its effective resistance over a very wide range by varying the gate-to-source voltage applied thereto.

Figure 6:
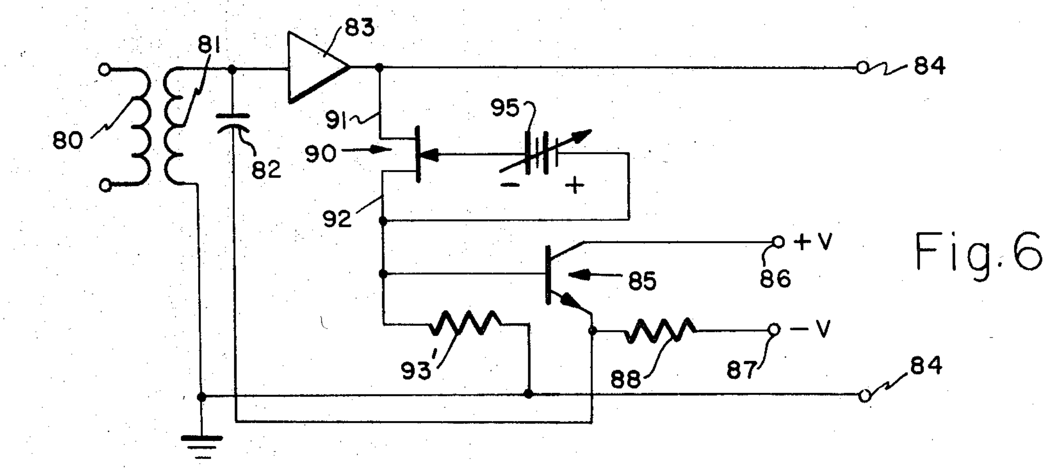
FIG. 6 is a circuit diagram of an alternative embodiment of the invention including a field-effect transistor for electronically varying the capacitance of a resonant circuit.

The circuit of FIG. 6 includes an input inductor 80 on which may be impressed, for example, a modulated carrier wave. The inductor 80 is inductively coupled to inductor 81, connected in parallel with a capacitor 82 to provide a parallel resonant input circuit. One terminal of the inductor 81 is grounded as shown, while the other terminal is connected to an amplifier shown schematically at 83. The output signal is obtained from output terminals 84, one of which is connected to the output of amplifier 83, while the other one is grounded as shown.

The feedback circuit now includes transistor 85, which may be of the npn type as shown. Its collector is connected to terminal 86, connected to a positive voltage. A negative voltage obtained from terminal 87 is connected by a resistor 88 to the emitter of the transistor 85, which is also connected to the capacitor 82. The base of the transistor 85 is coupled to the output of amplifier 83 through the field-effect transistor 90.

To this end, there is used a field-effect transistor 90, which may be of the n-channel type. The transistor has a drain 91 and a source 92. The drain 91 is connected to the output of amplifier 83 and the source 92 is connected directly to the base of transistor 85. A bias resistor 93 is connected between the base of transistor 85 and ground. Finally a variable battery 95 has its negative terminal connected to the gate of field-effect transistor 90 and its positive terminal to the source 92 thereof and also to the base of transistor 85.

Accordingly, the resistance represented by the field-effect transistor 90 may be varied by varying the voltage of battery 95. Such a direct-current voltage can more readily be remotely controlled. The resistance of the field-effect transistor 90 may be varied between a lower limit of 50 to 100 ohms up to hundreds of megohms. The effect of the transistor 90 may be explained, for example, by visualizing that a larger or smaller portion of the output signal is permitted to be impressed on the base of feedback transistor 85.

Figure 7:
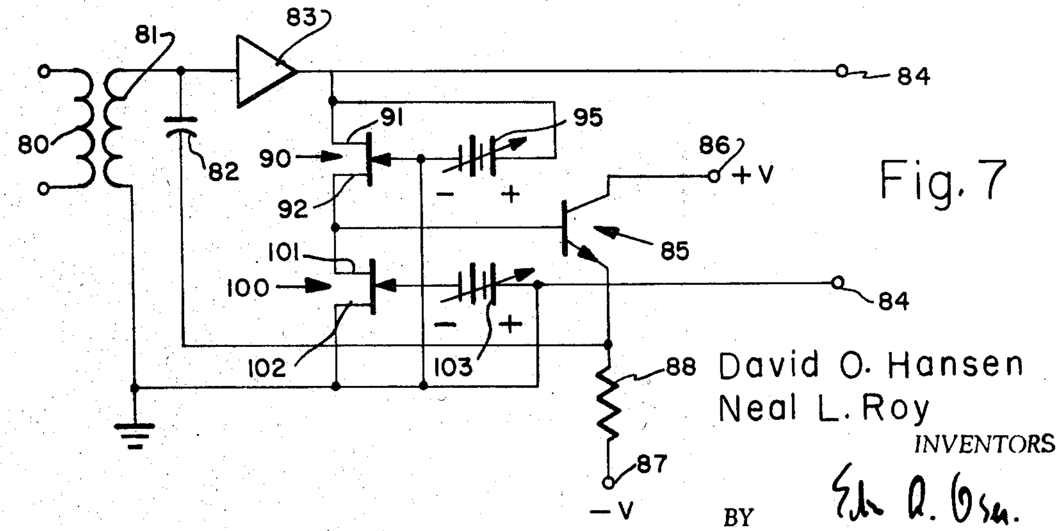
FIG. 7 is a circuit diagram similar to that of FIG. 6 but modified to permit a larger tuning range.

A larger tuning range than that of the circuit of FIG. 6 is obtainable with that of FIG. 7. Hence the resistor 93 is now replaced by another field-effect transistor 100, which may also be of the n-channel type and has a drain 101 and source 102. The drain 101 of transistor 100 is connected directly to the source 92 of transistor 90 and to the base of transistor 85. On the other hand, the source 102 is grounded. A variable battery 103 has its positive terminal connected to ground, that is, to the source 102 and its negative terminal connected to the gate of transistor 100.

In the first place by virtue of the transistor 85 the Q of the resonant circuit 81, 82 may be made high because there is negligible alternating current series impedance in the tank circuit 81, 82. In the second place, it will be noted that both batteries 95 and 103 are variable. Accordingly, the resistance represented by the field effect transistors 90 and 100 may be adjusted in opposite directions, hence vastly increasing the tuning range. Accordingly, due to this feature, the variable resistor represented by the two field-effect transistors may be varied between say 100 ohms and $10^{10}$ ohms. It will, of course, be appreciated that the feedback path includes transistors 90 and 85. The two field-effect transistors 90 and 100 may be considered a voltage divider connected between the output of amplifier 83 and ground. The junction of the voltage divider 90, 100 is connected to the base of feedback transistor 85. Thence by independently varying the effective resistance of each of transistor 90 and 100, the signal applied to feedback transistor 85 may be varied between wide limits.

It will be appreciated that both circuits of FIGS. 6 and 7 are particularly suited for use with an integrated circuit featuring remote tuning. The reason is that only a direct-current voltage need be generated and controlled, and since the impedance from gate to source of transistors 90 and 100 is high, these voltage sources may be quite high impedance sources. This may be effected through a long cable and any capacitance change due to the cable will not effect the operation of the circuit.

It is also feasible in accordance with the present invention to vary the passband of a bandpass or band-rejection filter. In that case, both the inductance and the capacitance of the filter must be changed simultaneously. Accordingly, the circuit of FIG. 1 applies again where Z may now either be a parallel or a series resonant circuit with both reactive components varied simultaneously. It will be understood that a parallel resonant circuit forms a bandpass filter, while a series resonant circuit provides a band-rejection filter.

Assuming the circuit of FIG. 1 is analyzed with the assumption that Z represents a resonant circuit, we obtain the following formula:

$$E_{out}=A_1E_g\frac{Z}{Z+Z_g(1-A_1A_2)} \qquad (8)$$

in the formula $E_{out}$ represents the output voltage obtained from terminals 15.

Figure 8:
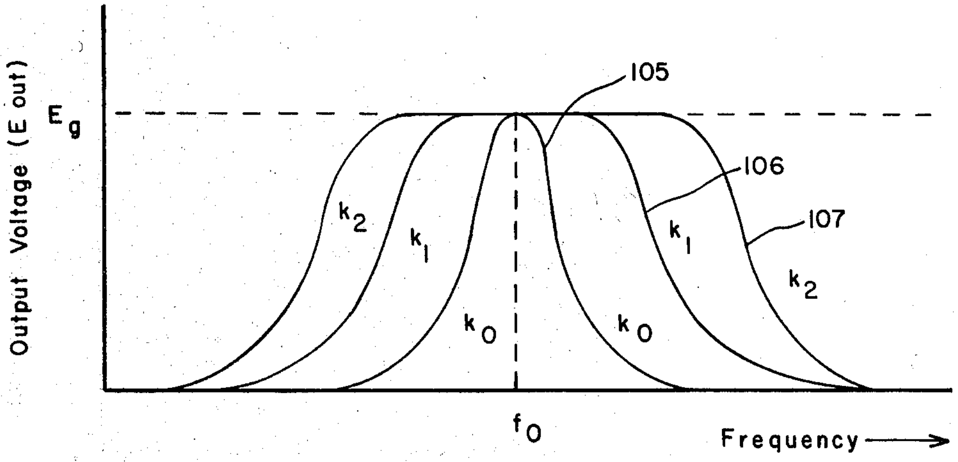
FIGS. 8 and 9 are curves illustrating how the passband of a bandpass filter and of a band-elimination filter may be varied in accordance with the present invention.

FIG. 8 to which reference is now made, shows an example of a bandpass filter where the output voltage $E_{out}$ is plotted as a function of frequency $f_0$ being the center frequency of the filter.

Thus a curve 105 shows a condition for $$K_0=A_1A_2=0$$

In other words, the product of the gains of the two amplifiers 14 and 16 is zero. Curve 106 shows a case where $k_1$ is between zero and 1 and this, of course, represents the product of the gain of the two amplifiers. Finally, curve 107 shows a condition where $k_2$ is larger than $k_1$, but is still less than one.

Figure 9:
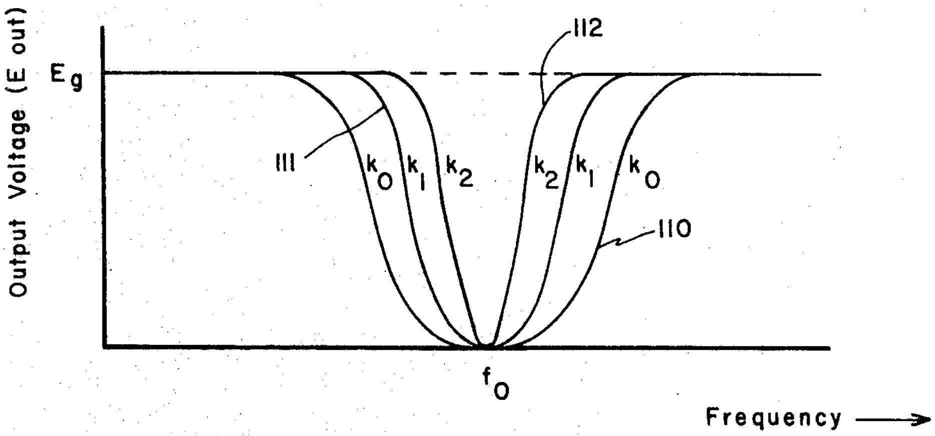

Finally, FIG. 9 shows a band-rejection filter. Here curve 110 represents the following condition:

$$K_0=A_1A_2=0$$

Curve 111 is for $k_1$ between zero and 1, while curve 112 shows the case where $k_2$ is larger than $k_1$ but less than 1.

It will therefore be appreciated that the principles of the present invention also apply to a filter where both the inductance and the capacitance of the resonant circuit are simultaneously varied.

There has thus been described an electronic circuit including a feedback amplifier for electronically varying the reactance of a reactive impedance element. For example it is feasible to vary either the capacitance or inductance of a resonant circuit for tuning a broadcast receiver. Alternatively, it is possible to vary the resonant frequency of an oscillator. This may be accomplished by varying the gain of a feedback amplifier beteen the output of the circuit and the terminal of an impedance element. Instead of varying the resistance of a resistor the feedback amplifier may also be varied by varying the direct-current voltage applied to an electronically variable resistance device such as a field-effect transistor. The tuning range may be increased by varying the voltage applied to two field-effect transistors in the signal path. Also the effective output resistance may be reduced to improve the Q of the resonant circuit. Finally, a filter may be varied in the same manner by increasing or decreasing the passband of bandpass or band-rejection filter.

What is claimed is:

1. An electronic circuit for electronically varying the reactance of a reactive impedance element comprising:

(a) a reactive impedance element;
(b) a source of a carrier wave signal coupled to said impedance element;
(c) a first amplifier coupled to said impedance element;
(d) means for deriving an output signal from said first amplifier;
(e) a second amplifier coupled between said first amplifier and said impedance element and providing a feedback between said first amplifier and said impedance element; and
(f) means for varying the gain of said second amplifier, the product of the gains of said first and second amplifiers being less than unity, whereby the reactive impedance of said impedance element may be varied by varying the gain of said second amplifier.

2. An electronic circuit as defined in claim 1 wherein said reactive impedance element is a capacitor.

3. An electronic circuit as defined in claim 1 wherein said reactive impedance element is an inductor.

4. An electronic circuit as defined in claim 1 wherein said reactive impedance element forms part of a resonant circuit.

5. An electronic circuit as defined in claim 1 wherein said reactive impedance element form part of a band-rejection filter, whereby the width of said band-rejection filter may be controlled.

6. An electronic circuit as defined in claim 1 wherein said reactive impedance element forms part of a bandpass filter, whereby the pass-band may be controlled.

7. An electronic circuit for electronically varying the capacitance of a capacitor comprising:

(a) a resonant circuit including a capacitor;
(b) a source of a carrier wave signal coupled to said resonant circuit;
(c) a first amplifier coupled to said capacitor;
(d) an output circuit for said first amplifier including a variable potentiometer; and
(e) a second amplifier coupled between said potentiometer and said capacitor for providing a feedback between said first amplifier and said capacitor, the product of the gains of said first and second amplifiers being less than unity, whereby the capacitance of said capacitor may be varied by varying said potentiometer.

8. An electronic circuit as defined in claim 7 wherein said first amplifier includes a field-effect transistor.

9. An electronic circuit as defined in claim 7 wherein said second amplifier includes a transistor.

10. An electronic circuit as defined in claim 7 wherein said second amplifier includes a first and a second transistor of opposite conductivity type, the collector of said first transistor being connected to the base of said second transistor, the emitter of said first transistor being connected to the collector of said second transistor, whereby an output signal may be derived from transistors and applied to said capacitor having a very low output resistance.

11. An oscillator circuit for electronically varying the resonant frequency of a resonant circuit comprising:

(a) a resonant circuit including a capacitor;
(b) a transistor;
(c) said resonant circuit being coupled to one of the electrodes of said transistor;
(d) a feedback connection between said resonant circuit and another electrode of said transistor to provide an oscillator for developing a wave having a frequency determined by the reactance of said capacitor;
(e) electronic means for varying the capacitance of said capacitor including a first and a second amplifier connected serially with said capacitor, the product of the gains of said amplifiers being less than unity; and
(f) means for varying the gain of one of said amplifiers, thereby to vary the capacitance of said capacitor and consequently, the resonant frequency of said oscillator.

12. An electric circuit for electronically varying the capacitance of a capacitor comprising:

(a) a resonant circuit including a capacitor;
(b) a source of a carrier wave signal coupled to said resonant circuit;
(c) a first amplifier coupled to said resonant circuit;
(d) means for deriving an output signal from said amplifier;
(e) a second amplifier coupled between said first amplifier and said capacitor and providing a feedback between said first amplifier and said capacitor; and
(f) electronically variable resistance means connected serially with said amplifier between said first amplifier and said capacitor for electronically varying the resistance of said resistance means to vary the signal applied to said second amplifier, the product of the gains of said first and second amplifiers being less than unity, whereby the capacitance of said capacitor may be varied electronically.

13. An electronic circuit as defined in claim 12 wherein said resonant circuit is a parallel resonant circuit.

14. An electronic circuit as defined in claim 13 wherein said electronic means includes a field-effect transistor connected serially between said first and second amplifier, and means for varying the voltage applied to said field-effect transistor.

15. An electronic circuit as defined in claim 13 wherein said electronic means includes a first and a second field-effect transistor, said field-effect transistors being connected serially between said first amplifier and a point of fixed potential and form a voltage divider network, the junction of said field-effect transistors being connected to the input of said second amplifier, a separate variable voltage source for each of said field-effect transistors for separately varying the voltage applying thereto, whereby the effective resistance provided by said field-effect transistors may be individually varied to vary the gain of said second amplifier over a wide range.

No references cited.

JOHN KOMINSKI, Primary Examiner

U.S. Cl. X.R.

331—177; 332—16; 333—80; 334—15